United States Patent
Eden et al.

[11] Patent Number: 6,114,697
[45] Date of Patent: Sep. 5, 2000

[54] BANDGAP RADIATION DETECTOR

[75] Inventors: Dayton Dale Eden, Dallas; William Edward Case, Arlington; Thomas R. Schimert, Grand Prairie, all of Tex.

[73] Assignee: Lockheed Martin Corporation, Bethesda, Md.

[21] Appl. No.: 07/092,736

[22] Filed: Aug. 5, 1987

Related U.S. Application Data

[63] Continuation-in-part of application No. 06/901,071, Jul. 14, 1986.

[51] Int. Cl.$^7$ .............................. G01J 5/00; H01Q 1/00; H01L 29/80; H01L 31/00
[52] U.S. Cl. ............................... 250/338.1; 250/338.4; 250/332; 257/258; 257/275; 257/442; 257/448; 343/721; 343/727; 343/793
[58] Field of Search ............................ 250/332, 338.4, 250/338.1; 357/30.11; 257/258, 275, 442, 448; 343/721, 727, 793

[56] References Cited

U.S. PATENT DOCUMENTS

| | | |
|---|---|---|
| 3,755,678 | 8/1973 | Javan . |
| 4,445,050 | 4/1984 | Marks . |
| 4,591,717 | 5/1986 | Scherber ............................. 250/338.4 |
| 4,614,957 | 9/1986 | Arch et al. ................................ 357/30 |
| 4,639,756 | 1/1987 | Rosbeck et al. ......................... 357/30 |
| 5,248,884 | 9/1993 | Brewitt-Taylor et al. ........... 250/338.4 |
| 5,455,421 | 10/1995 | Spears ................................. 250/338.4 |

FOREIGN PATENT DOCUMENTS 2051477  1/1981  United Kingdom .

OTHER PUBLICATIONS

"Antenna–coupled infrared detectors", S. E. Schwarz & B. T. Ulrich, Jour. of Appl. Phys., vol. 48, No. 5, May, 1977, pp. 1870–1873.

"Planar Multimode Detector Arrays for Infrared and Millimeter–Wave Applications", D.B. Rutledge & S. E. Shwarz, IEEE Journal of Quantum Electronics, vol. QE 17, No. 3, Mar. 1981, pp.

"The CdTe/HgTe superlattice: Proposal for a new infrared material", J. N. Schulman and T.C. McGill, Appl. Phys. Lett. 34(10), May, 1979, pp. 663–665.

"Theory of generation–recombination noise in intrinsic photo–conductors", D.L. Smith, J. Appl. Phys. 53(10), Oct. 1982, pp. 7051–7060.

"Microbolometers for infrared detection", Tien–Lai Hwang, S.E. Schwarz and D. B. Rutledge, Appl. Phys. Lett. 34(11) Jun. 1, 1979, pp. 773–776.

Effects of blocking contacts on generation–recombination noise and responsivity in intrinsic photoconductors, J. Appl. Phys., Smith, 56(6), Sep. 15, 1984, pp. 1663–1669.

"Solid–State Superlattices", Gottfried H. Dohler, pp. 144–151.

"HgCdTe heterojunction contact photoconductor", D.L. Smith, D.K. Arch, R.A. Wood and M. Wlater Scott, Appl. Phys. Lett. 45(1), Jul. 1, 1984, pp. 83–85.

"Ogranic Crystals and Polymers—A New Class of Nonlinear Optical Materials", Anthony F. Garito & Kenneth D. Singer, Dept. of Physics and Laboratory for Research on the Structure of Matter, Univ. of Pennsylvania.

"Molecular Beam Expitaxial Growth of High Quality HgTe and $Hg_{1-x}Cd_xTe$ Onto GaAs (001) Substrates", J.P. Faurie, S. Sivananthan, M. Boukerche & J. Reno, Appl. Phys. Lett. 45(12), Dec. 15, 1984, pp. 1307–1309.

*Primary Examiner*—Stephen C. Buczinski
*Attorney, Agent, or Firm*—Sidley & Austin; Stephen S. Sadacca

[57] ABSTRACT

An infrared radiation detector device has an array of detectors each of which comprises a pattern of parallel detector elements. Each detector produces a pixel signal for an image. The elements of the detector are photoconductive or photovoltaic bandgap materials and the elements are spaced apart at a dimension which is equal to or less than the wavelength of the radiation to be received. Additional layered structures above and/or below the detector elements provide impedance matching between free space radiation and the radiation impedance of the detector elements to increase the capture of radiation.

28 Claims, 2 Drawing Sheets

(LARGE AREA DETECTOR)

BANDGAP RADIATION DETECTOR

This is a continuation-in-part of Ser. No. 06/901,071, filed Jul. 14, 1986, which is assigned to the same assignee.

FIELD OF THE INVENTION

The present invention pertains in general to radiation detection devices and in particular to such devices for detecting infrared radiation.

BACKGROUND OF THE INVENTION

Infrared radiation detectors have become particularly important for the capability of producing images at night and through haze and smoke. Conventional imagers have large area detector elements for each picture element (pixel) of an image. Each such detector element has length and width dimensions which are longer than the wavelength of the radiation that it captures. A conventional detector of this type is shown in "Semiconductors and Semimetals", Vol. 18, Mercury Cadmium Telluride, Academic Press, 1981, pp. 162–163.

Although conventional infrared detectors can successfully produce useful images, they have serious limitations in their operation. For a given input power of incident radiation, the resulting signal strength of these devices is relatively low. Further, conventional devices must be operated in a very cold environment to produce usable image signals.

Therefore, there is a great need for an improved infrared detector which can produce a greater amplitude signal with less requirement for complex cooling apparatus.

SUMMARY OF THE INVENTION

A selected embodiment of the present invention is a detector for infrared radiation. A substructure is provided for supporting a periodic pattern of photoconductive or photovoltaic, bandgap detector elements. The substructure also functions to match the radiation impedance of the pattern of detector elements to the free space radiation impedance of the infrared radiation. The elements are spaced apart with a period which is equal to or less than the wavelength of the infrared radiation and the elements themselves have dimensions much less than the wavelength of the detected radiation. The detector elements are electrically connected to produce a signal when the structure is exposed to infrared radiation.

BRIEF DESCRIPTION OF THE DRAWINGS

For a more complete understanding of the present invention, reference is now made to the following detailed description taken in conjunction with the drawings in which.

DETAILED DESCRIPTION OF THE INVENTION

Figure 1:
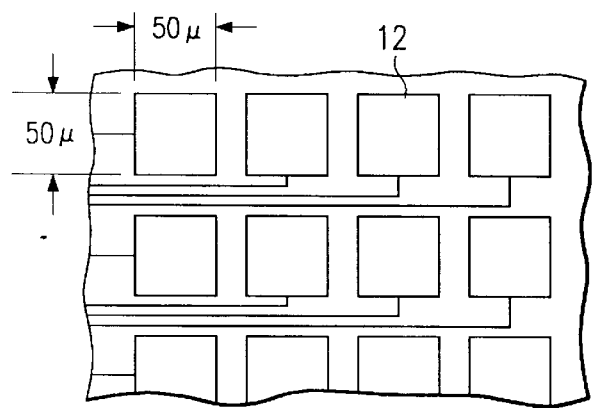
FIG. 1 is a plan view illustrating a conventional infrared radiation detector.

The present invention is an infrared radiation detector which produces an output signal when exposed to infrared radiation. A conventional infrared radiation detector 10 is shown in FIG. 1. Infrared radiation having a wavelength of 8–12 microns is of principal interest for detection due to its propagation characteristics through the atmosphere. The conventional detector 10 has large area detector elements, such as element 12, for capturing incident infrared radiation. The detector element 12 has typical length and width dimensions of 50 microns. The 50 micron dimensions are substantially greater than the 8–12 micron wavelength of the intercepted radiation. This large area detector configuration serves to capture the incident radiation over areas which approximately correspond to the size of a pixel (picture element) in an image. Each of the detector elements, such as 12, produces a pixel signal and these signals are used in combination to produce an image.

Figure 2:
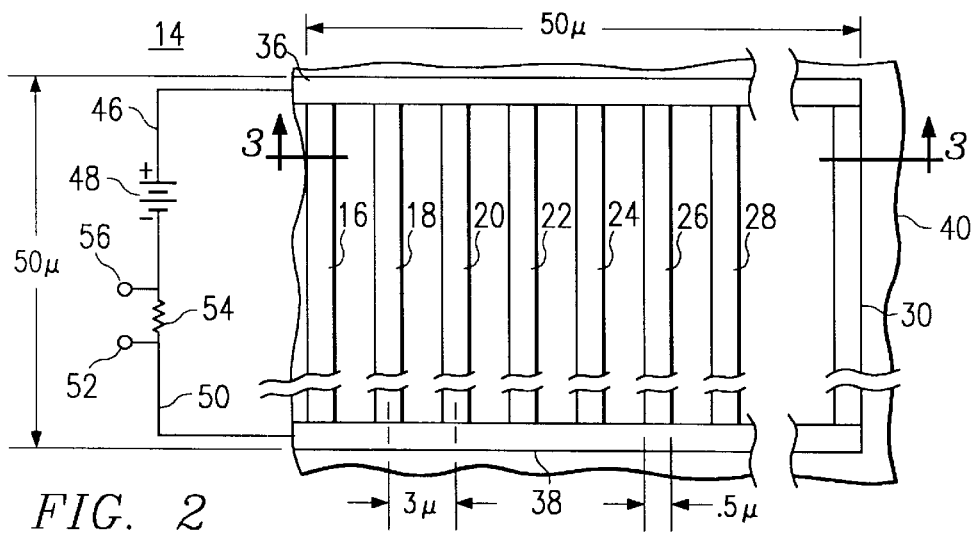
FIG. 2 is a plan view of an infrared radiation detector in accordance with the present invention.

An infrared radiation detector 14 in accordance with the present invention is illustrated in FIG. 2. The detector 14 has a periodic, parallel, pattern of photoconductive or photovoltaic, bandgap detector elements 16, 18, 20, 22, 24, 26, 28 and 30. These elements must be made of a radiation absorbing material. A preferred material for these detector elements is mercury cadmium telluride which is described as $Hg_{(1-x)} Cd_{(x)} Te$ where a selected value of x is 0.2. The detector elements 16–30 are joined together at opposite ends by respective common lines 36 and 38, which are typically made of metal, such as aluminum. In a selected embodiment the detector elements 16–30 are etched from a single layer of mercury cadmium telluride.

The detector elements 16–30 and common lines 36, 38 are fabricated on a substructure 40 which serves multiple functions. Substructure 40 provides a support for the elements 16–30 and lines 36, 38 and, quite significantly, it provides impedance matching between free space radiation and the radiation impedance of the pattern of detector elements 16–30. The substructure 40 contains layers with indices of refraction (n) different from that of air or free space. The substructure 40 increases the radiation absorption of the detector 14.

Figure 3:
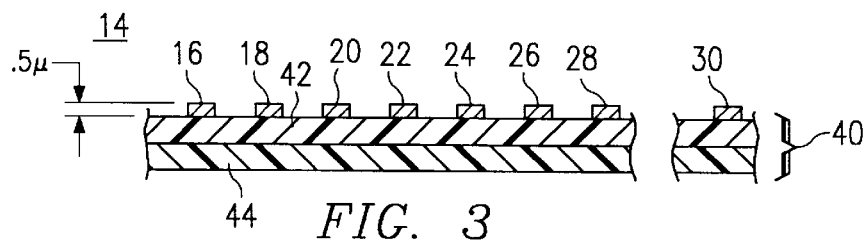
FIG. 3 is a section view taken along Lines 3—3 of the radiation detector shown in FIG. 2.

Referring also to FIG. 3, the substructure 40 comprises separate layers 42 and 44. Layer 42 is preferably indium antimonide and layer 44 is preferably cadmium telluride. Layer 42 has an index of refraction n=4 and layer 44 has an index of refraction n=2.7 where n=1 for free space.

The pattern of detector elements 16–30 as shown in FIG. 2 comprises a pixel having overall dimensions of 50 microns by 50 microns. This structure is designed for receiving 8–12 micron infrared radiation. Each of the detector elements 16–30 has a width of approximately 0.5 micron and a length of approximately 50 microns. The preferable period or centerline to centerline spacing between the elements 16–30 is 3 microns. A preferred thickness for each of the elements 16–30 is 0.5 micron. A preferred thickness for each of the layers 42 and 44 is in the range of 0.1–10 microns.

It has been determined that there is a limiting criteria for effective operation of the present invention as shown in FIGS. 2 and 3. For normal incident radiation, this criteria has two aspects, first, the wavelength (2) of the incident radiation must be greater than or equal to the product of the periodic spacing (p) between the detector elements and the index of refraction ($n_2$) for the lower layer, that is, layer 44 as shown in FIG. 3. This is expressed as $\lambda > n_2 p$. Second, the upper layer 42 must have a greater index of refraction ($n_1$) than the index of refraction ($n_2$) for the lower layer 44. This is expressed as $n_1 > n_2$. When these two aspects have been met, the absorption of incident radiation for the present invention can approach 100%. When this criteria is not met, a detector such as 14 shown in FIG. 3, will be limited to a maximum absorption of less than 50%.

While the detailed theoretical operation of the present invention is not yet fully understood, it appears that the incident radiation, which is not directly absorbed by the detector elements 16–30, is essentially trapped in the layer 42 due to the different indices of refraction between layer 42 and layer 44 on one side and layer 42 and free space on the opposite side.

The incident radiation is likely diffracted by the detector elements 16–30 to alter its propagation direction away form the normal incidence path. The trapped radiation is absorbed when it ultimately strikes the detector elements 16–30 after possibly many reflections. It appears that radiation which does escape from layer 42 back into free space through the plane of the detector elements 16–30 is cancelled by the incoming incident radiation, thereby contributing to the overall absorption of incident radiation.

All of the detector elements 16–30 are connected in parallel between the lines 36 and 38. Line 36 is connected through a conductor 46 to the terminal of a DC source or battery 48. Line 38 is connected through a conductor 50 to a terminal 52. A resistor 54 is connected between terminal 52 and a terminal 56. The remaining terminal of battery 48 is connected to terminal 56. The battery 48 applies a bias across the detector elements 16–30 and the resistor 54 serves as a series load. When infrared radiation is captured by the detector 14, electrons in the detector elements 16–30 are boosted to higher energy bands which alters the current flow produced by the battery 48. This translates to changes in the current through resistor 54 which alters the voltage between the terminals 52, 56. Thus, the detector 14 produces a pixel signal at terminals 52, 56. An array of detectors, such as detector 14, produces a complete image by generating a signal for each pixel.

The detector of the present invention has greater responsivity because of the higher captured radiation power density in the sensitive material as compared to a conventional infrared detector. For example, the detector 12 in FIG. 1 and the detector 14 in FIG. 2 have the same overall planar dimensions. Detector 12 has an active area of 2,500 square microns with a typical thickness of 10 microns, but detector 14 has an active area of only about 425 square microns with a typical thickness of 0.5 microns. With equal incident radiation intensity, the detector 14 will have approximately 120 times greater power density in the sensitive elements, which provides a substantial increase in performance. As with widths of the elements of the detector 14 become smaller, the increase in power density becomes greater. The detector of the present invention therefore offers a substantial performance advantage over conventional large area detectors.

The substructure 40 serves to provide impedance matching between free space radiation impedance and the radiation impedance of the detector 14 elements 16–30. A basic measure of performance for a radiation detector is the percent of absorption for incident radiation. Without the substructure 40, the elements 16–30 have a radiation absorption of less than 5% but with the addition of the substructure 40, which meets the above criteria, the absorption is increased to over 80%, as indicated by computer simulations.

The various detectors illustrated for the present invention employ parallel detector strips, but in general, periodic elements of any shape can be used provided that the spacing between the elements is less than or equal to the wavelength of the incident radiation.

Figure 4:
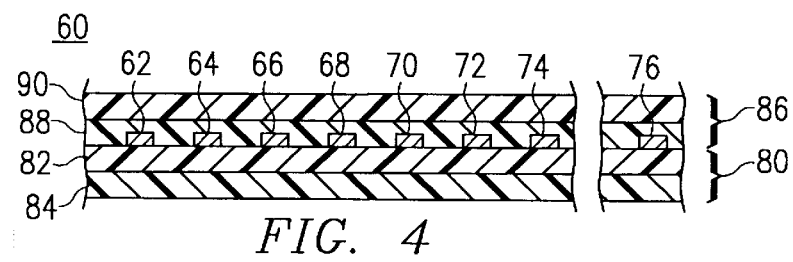
FIG. 4 is a section view of an alternative embodiment of the present invention.

A further embodiment of the present invention is shown in FIG. 4. A detector 60 is similar to the detector 14 shown in FIGS. 2 and 3 but with the addition of a superstructure to provide additional impedance matching between the detector elements and free space impedance. Detector 60 has a set of parallel detector elements 62, 64, 66, 68, 70, 72, 74 and 76 which are the same as the detector elements 16–30 in detector 14. Detector 60 has a substructure 80 comprising layers 82 and 84 which correspond to the layers 42 and 44 in detector 14. The detector 60 also includes a superstructure 86 comprising layers 88 and 90. Layer 88 is similar to layer 42 in detector 14 and layer 90 is similar to layer 44 in detector 14. The superstructure 86 functions like the substructure 40 for improving the impedance match between elements 62–76 and free space radiation impedance.

Figure 5:
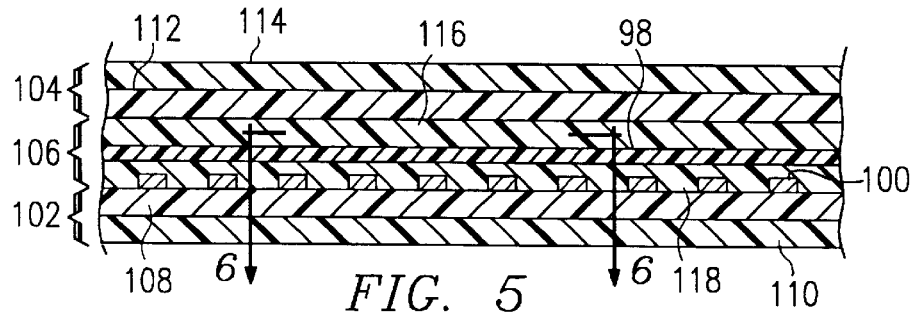
FIG. 5 is a section view of a further embodiment of the present invention employing orthagonal detector sets.
Figure 6:
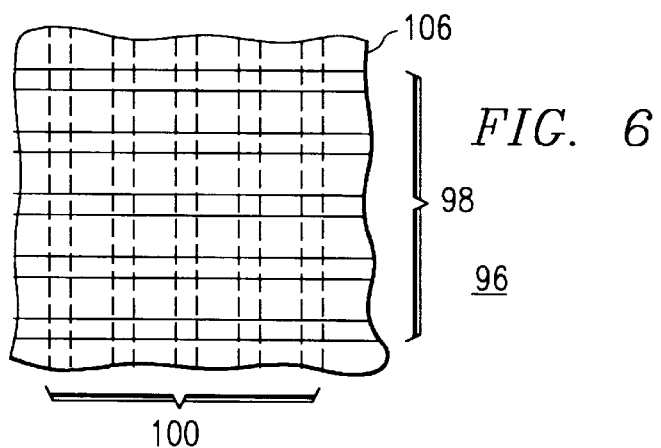
FIG. 6 is a plan, partially cut away view, of the two detector set embodiment shown in FIG. 5.

A further embodiment of the present invention is a detector 96, which is shown in FIGS. 5 and 6. The detector 96 has detector element sets 98 and 100 each of which is the same and electrically connected in the same manner as the detector elements 16–30 in detector 14 shown in FIG. 2. However, the detector elements in set 98 are orthogonal to the detector elements in set 100. The detected signals from the two sets can be electrically combined. The detector 96 has a substructure 102, a superstructure 104 and a midstructure 106. The substructure 102 comprises layers 108 and 110 and the superstructure 104 comprises layers 112 and 114. Substructure 102 corresponds to substructure 80 and superstructure 104 corresponds to superstructure 86.

Midstructure 106 has layers 116 and 118 each of which is preferably a material such as cadmium telluride having a thickness of approximately 0.1 to 10 microns. Detector set 98 is in layer 116 and detector set 100 is in layer 118. The two detector element sets 98, 100 are oriented orthogonally to capture orthogonal polarizations of the incoming radiation. The structure shown in FIG. 2 captures only one polarization. A sectioned planar view of detector 96 is shown in FIG. 6 with the superstructure 104 removed and the detector elements in set 100 shown by dotted lines.

Figure 7:
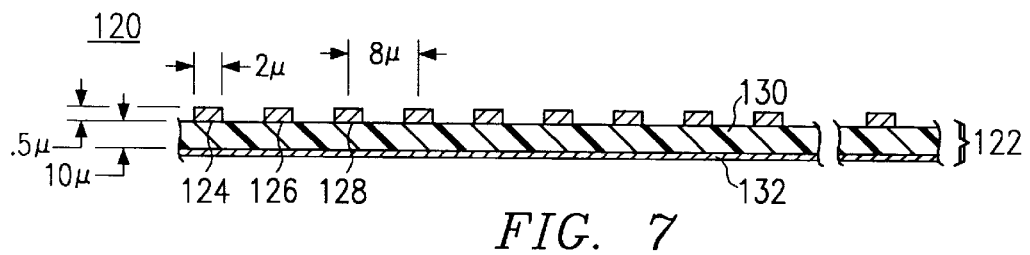
FIG. 7 is an elevation view of a still further embodiment of the present invention.

A still further embodiment of the present invention is a detector 120 shown in FIG. 7. This detector has a substructure 122, which is, for example, a dielectric layer or plate 130 preferably made of cadmium telluride having a thickness of 0.1 to 10 microns. On the surface of the substructure 122 there are positioned a plurality of parallel detector elements such as 124, 126 and 128. These elements are arranged and connected in the manner shown in FIG. 2 for elements 16–30. The elements 124–128 are made of the same material as elements 16–30. On the lower surface of plate 130 there is provided a layer 132 comprising a metal, such as aluminum. Layer 132 has a preferable thickness of 0.5 microns. The substructure 122 comprises the dielectric plate 130 and the metal layer 132.

The dielectric plate 130 has a preferred thickness depending on the wavelength of the incident radiation. The preferred thickness is an odd multiple of a quarter wavelength of the received radiation. For a 12 micron radiation wavelength, a thickness of up to 10 microns is acceptable. Computer simulations indicate that the detector 120, with the illustrated dimensions, will have a radiation absorption of almost 100%.

The detector 120 operates in the same manner as the detector 14 described above. The metal layer 132 provides the lower reflective surface just as the interface between the layers 42 and 44 provides a reflective surface.

Figure 8:
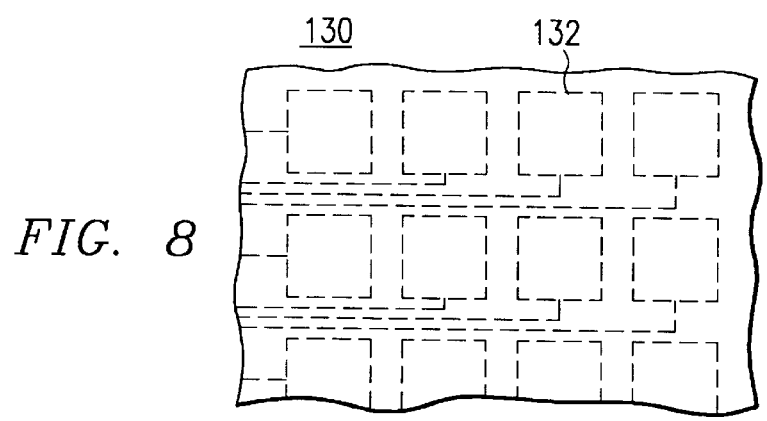
FIG. 8 is a plan view of a radiation imager utilizing the infrared radiation detector of the present invention.

An infrared imager 130 in accordance with the present invention is shown in FIG. 8. The imager 130 has an array of detectors, such as detector 132. Each of the detectors, such as 132, produces a pixel signal and the collection of pixel signals taken together form an image. Each of the detectors in the imager 130 has a separate output line for that detector's pixel signal. The imager 130 can utilize for detectors 132 any one of the detectors 14, 60, 96 or 120 described above.

Although several embodiments of the invention have been illustrated in the accompanying drawings and described in the foregoing Detailed Description, it must be understood that the invention is not limited to the embodiments disclosed but is capable of numerous rearrangements, modifications and substitutions without departing from the scope of the invention.

What we claim is:

1. A detector for radiation, comprising:

a periodic pattern of photoconductive or photovoltaic, bandgap detector elements spaced apart at a period which is equal to or less than the wavelength of said radiation, said pattern of detector elements having a given radiation impedance, substructure means for supporting said detector elements and for providing impedance matching between the radiation impedance of said pattern of detector elements and free space radiation impedance, and means for electrically connecting said detector elements for producing a detection signal when said detector is exposed to said radiation.

2. A detector as recited in claim 1 wherein said substructure means comprises a dielectric plate having said detector elements on one surface thereof and a metal layer on an opposite surface thereof.

3. A detector as recited in claim 1 including a planar superstructure means adjacent said pattern of detector elements and opposite said substructure means, said superstructure means for providing impedance matching between said detector elements and free space impedance.

4. A detector as recited in claim 1 wherein said detector elements comprise mercury cadmium telluride.

5. A detector as recited in claim 1 wherein said substructure means comprises first and second layers having different indices of refraction.

6. A detector as recited in claim 5 wherein said first layer is indium antimonide and said second layer is cadmium telluride.

7. A detector as recited in claim 1 wherein said detector elements are parallel, elongate strips.

8. A detector as recited in claim 1 including a second periodic pattern of photoconductive or photovoltaic, bandgap detector elements spaced apart at a period which is equal to or less than the wavelength of said radiation, said second pattern of detector elements orthogonal to said first pattern of detector elements and located in a plane offset from and parallel to said first pattern of detector elements and means for electrically connecting said second pattern of detector elements for producing a detection signal when said detector is exposed to said radiation.

9. A detector for radiation, comprising:

a periodic pattern of parallel, elongate, photoconductive or photovoltaic, bandgap detector elements spaced apart at a period which is equal to or less than the wavelength of said radiation, said pattern of detector elements having a given radiation impedance, substructure means for supporting said detector elements and for providing impedance matching between the radiation impedance of said detector elements and free space radiation impedance, and means for electrically connecting said detector elements for producing a detection signal when said detector is exposed to said radiation.

10. A detector as recited in claim 9 wherein said substructure means comprises a dielectric plate having said detector elements on one surface thereof and a metal layer on an opposite surface thereof.

11. A detector as recited in claim 9 including a superstructure means adjacent said pattern of detector elements and opposite said substructure means for providing impedance matching between said detector elements and free space impedance.

12. A detector as recited in claim 9 wherein said detector elements comprise mercury cadmium telluride.

13. A detector as recited in claim 9 wherein said substructure means comprises a first and a second layer having different indices of refraction.

14. A detector as recited in claim 13 wherein said first layer is indium antimonide and said second layer is cadmium telluride.

15. A detector as recited in claim 9 including a second periodic pattern of parallel, elongate, photoconductive or photovoltaic, bandgap detector elements spaced apart at a period which is equal to or less than the wavelength of said radiation, said second pattern of detector elements orthogonal to said first pattern of detector elements and located in a plane offset from and parallel to said first pattern of detector elements and means for electrically connecting said second pattern of detector elements for a producing a detection signal when said detector is exposed to said radiation.

16. A detector for radiation comprising:

a dielectric plate, a periodic pattern of photoconductive or photovoltaic, bandgap detector elements spaced apart at a period which is equal to or less than the wavelength of said radiation, said detector elements mounted on said dielectric, and a conductive layer joined to a surface of said dielectric opposite said pattern of detector elements, wherein the combination of said dielectric plate and said conductive layer serves to increase the absorption of said pattern of detector elements, and means for electrically connecting said detector elements to produce a detection signal when said detector is exposed to said radiation.

17. A detector as recited in claim 16 wherein said detector elements are parallel, elongate strips.

18. A detector as recited in claim 16 wherein the thickness of said substructure is approximately an odd multiple of one quarter the wavelength of said radiation.

19. A detector as recited in claim 16 wherein said detector elements are mercury cadmium telluride.

20. A detector as recited in claim 16 wherein said substructure is cadmium telluride.

21. A radiation imager, comprising:

a substructure means, an array of detectors spaced uniformly on said substrate means, each detector comprising a periodic pattern of photoconductive or photovoltaic, bandgap detector elements spaced apart at a period which is equal to or less than the wavelength of said radiation, said detectors having a given radiation impedance, and electrical means for connecting said detector elements to produce a detection signal for each of said detectors, said substructure means for providing impedance matching between the radiation impedance of said detectors and free space radiation impedance, and said detection signals comprising an image signal when said imager is exposed to said radiation.

22. A radiation imager as recited in claim 21 including a planar superstructure means adjacent said array of detectors and opposite said substructure means, said superstructure means for providing impedance matching between said detectors and free space impedance.

23. A radiation imager as recited in claim 21 wherein said substructure means comprises a dielectric plate having said detector elements on one surface thereof and a metal layer on an opposite surface thereof.

24. A radiation imager as recited in claim 21 wherein said detector elements are mercury cadmium telluride.

25. A radiation imager as recited in claim 21 wherein said substructure means comprises first and second layers having different indices of refraction.

26. A radiation imager as recited in claim 25 wherein said first layer is indium antimonide and said second layer is cadmium telluride.

27. A radiation imager as recited in claim 21 wherein said detector elements are parallel, elongate strips.

28. A radiation imager as recited in claim 21 including a second periodic pattern of parallel, elongate, photoconductive or photovoltaic, bandgap detector elements spaced apart at a period which is equal to or less than the wavelength of said radiation, said second pattern of detector elements orthogonal to said first pattern of detector elements and located in a plane offset from and parallel to said first pattern of detector elements and means for electrically connecting said second pattern of detector elements for producing a detection signal when said detector is exposed to said radiation.

* * * * *